United States Patent [19]
Akiya

[11] Patent Number: 5,752,171
[45] Date of Patent: May 12, 1998

[54] TRANSMISSION LEVEL CONTROL SYSTEM WITH SELECTIVELY FIXED OR VARIABLE AMPLICATION CONTROL

[75] Inventor: Makoto Akiya, Saitama, Japan

[73] Assignee: NEC Corporation, Tokyo, Japan

[21] Appl. No.: 651,495

[22] Filed: May 22, 1996

[30] Foreign Application Priority Data

May 22, 1995 [JP] Japan .................................. 7-122181

[51] Int. Cl.$^6$ .................................................. H04B 1/04
[52] U.S. Cl. .......................... 455/126; 455/115; 330/279
[58] Field of Search ............................ 455/115, 116, 455/126, 127, 117, 129; 330/138, 280, 279

[56] References Cited

U.S. PATENT DOCUMENTS

| | | |
|---|---|---|
| 5,128,629 | 7/1992 | Trinh . |
| 5,170,495 | 12/1992 | McNicol et al. .................. 455/126 |
| 5,196,806 | 3/1993 | Ichihara ............................ 455/126 |
| 5,313,658 | 5/1994 | Nakamura ........................ 455/126 |
| 5,507,016 | 4/1996 | Okuhara ........................... 455/115 |
| 5,515,008 | 5/1996 | Ueda et al. ....................... 330/280 |
| 5,566,363 | 10/1996 | Senda ............................... 455/115 |

FOREIGN PATENT DOCUMENTS 60-3219 1/1985 Japan .

*Primary Examiner*—Edward F. Urban
*Attorney, Agent, or Firm*—Young & Thompson

[57] ABSTRACT

A transmission level control circuit includes a negative feedback control loop and a level setting controller. A first amplifier amplifies an input signal by a variable amplification factor to produce a first signal. A second amplifier receives the first signal and produces a second signal according to a control signal such that the first signal is amplified when the control signal is in a first state and the first signal is attenuated when the control signal is in a second state. An output signal produced by a third amplifier amplifying the second signal is monitored by a detector which detects an output level of the output signal. A controller performs the negative feedback control when the control signal is in the first state, and performs the level setting control such that the variable amplification factor is set so as to set the output level at a relatively lower level when the control signal is in the second state.

43 Claims, 4 Drawing Sheets

TRANSMISSION LEVEL CONTROL SYSTEM WITH SELECTIVELY FIXED OR VARIABLE AMPLICATION CONTROL

BACKGROUND OF THE INVENTION

1. Field of the Invention

The present invention relates to a transmitter for use in radio communications equipment such as a satellite communication device, and in particular to a transmission level control system which enables controlling the transmission output level of the transmitter.

2. Description of the Related Art

In general, a radio transmitter for use in a satellite communication device is provided with an automatic level control (ALC) loop which causes the output level of the transmitter to be kept in the stable state. A transmitter having such a conventional ALC loop is disclosed in Japanese Patent Unexamined Publication No. 60-3219. This transmitter is composed of a PIN diode attenuator, an ALC amplifier, and a detector. The PIN diode attenuator and the detector are connected to the input and output terminals of the transmitter, respectively. The ALC amplifier makes the ALC loop OFF when a failure is detected in a working transmission system and ON when a protection transmission system has been activated. When the ALC loop switches into off, a fixed bias voltage is applied to the PIN diode attenuator, which causes the power level of a transmission signal to be fixed.

However, the dynamic range of the transmitter is restricted within the range which is determined by that of the detector when the ALC loop is in the ON state. For instance, the dynamic range of the transmitter is a maximum of 20 dB. On the other hand, when the ALC loop is in the OFF state, the dynamic range of the transmitter may be extended to the variable attenuation range of the PIN diode attenuator which is wider than the dynamic range of the detector. However, since the transmission output signal is reduced in power level by the PIN diode attenuator, an extra gain is necessary for the power amplifier of the transmitter to compensate for the power reduction of the transmission output signal. This results in the increased power consumption of the transmitter.

SUMMARY OF THE INVENTION

An object of the present invention is to provide a transmission level control circuit which achieve the extended dynamic range with lower power consumption.

Another object of the present invention is to provide a transmission level control circuit which enables effectively controlling the power level of a transmission signal with lower power consumption.

Still another object of the present invention is to provide a transmission level control circuit which enables the stable level control of the transmission signal with a simple circuit arrangement.

According to the present invention, a transmission level control is performed in a control mode selected from different modes according to a control signal. The different modes include a level control mode based on a negative feedback control and a level setting control mode including a switching control between amplification and attenuation. More specifically, after a first amplifier amplifies an input signal by a variable amplification factor to produce a first signal, a second amplifier receives the first signal and produces a second signal according to the control signal such that the first signal is amplified to produce the second signal when the control signal is in a first state and the first signal is attenuated to produce the second signal when the control signal is in a second state. An output signal produced by a third amplifier amplifying the second signal is monitored by a detector which detects an output level of the output signal. A controller performs the level control such that the variable amplification factor is adjusted based on the output level so as to keep the output level at a first predetermined level when the control signal is in the first state, and performs the level setting control such that the variable amplification factor is set at a predetermined value so as to set the output level at a second predetermined level lower than the first predetermined level when the control signal is in the second state.

The controller is comprised of a feedback control circuit for controlling the first amplifier such that the variable amplification factor is adjusted based on the output level so as to keep the output level at the first predetermined level, and a setting control circuit for setting the feedback control circuit such that the variable amplification factor is set at the predetermined value when the control signal is in the second state.

The feedback control circuit is comprised of a comparator for comparing the output level to a predetermined reference level to produce a comparison signal, a counter for either incrementing or decrementing according to the comparison signal to produce a digital count value, and a converter for converting the digital count value into an analog voltage corresponding to the digital count value and supplying the analog voltage to the first amplifier to adjust the variable amplification factor.

The setting control circuit is preferably comprised of a memory for storing setting data which sets the feedback control circuit such that the variable amplification factor is set at the predetermined value, and a selector for selecting the setting data to provide the setting data to the feedback control circuit when the control signal is in the second state. A counter controller may be used to control the counter such that the digital count value is fixed to a value corresponding to the setting data when the control signal is in the second state.

The first amplifier preferably is a variable gain amplifier including a single bipolar transistor, wherein the analog voltage is applied to a collector of the bipolar transistor as a power supply voltage.

Further, the second amplifier is preferably comprised of an amplifier for amplifying the first signal to produce the second signal, and a power controller for activating the amplifier according to the control signal. Alternatively, a switch may be used to switch the amplifier on or off according to the control signal. The switch supplies power to the amplifier when the control signal is in the first state and removes the power from the amplifier when the control signal is in the second state. In this case, the amplifier comprises a single bipolar transistor, wherein the power is supplied to a collector of the single bipolar transistor through the switch.

In another embodiment, the second amplifier is further comprised of an impedance matching circuit in order to match the impedance of the input and output sides of the amplifier such as the single bipolar transistor.

As described above, the transmission level control according to the present invention is performed in a control mode selected from the level control mode and the level setting control mode including the switching control of the second amplifier between amplification and attenuation according to the control signal. Therefore, the dynamic range of the output signal can be extended by the gain of the second amplifier when the second amplifier is active and the attenuation of the second amplifier when inactive in addition to the dynamic range of the first amplifier.

Further, since there is no need of a variable attenuator to control the output level, the circuit arrangement is relatively simple, resulting in reduced power consumption.

Furthermore, since the level setting control is performed based on the setting data previously stored in the memory, a desired output level may be set when the control signal is in the second state. Therefore, the transient operation of the transmission level control circuit become stable and smooth when the control mode returns to the level control mode.

BRIEF DESCRIPTION OF THE DRAWINGS

FIG. 4A is a graph showing the gain deviation characteristics of the preamplifier when a power switch is on;

DETAILED DESCRIPTION OF THE PREFERRED EMBODIMENTS

Figure 1:
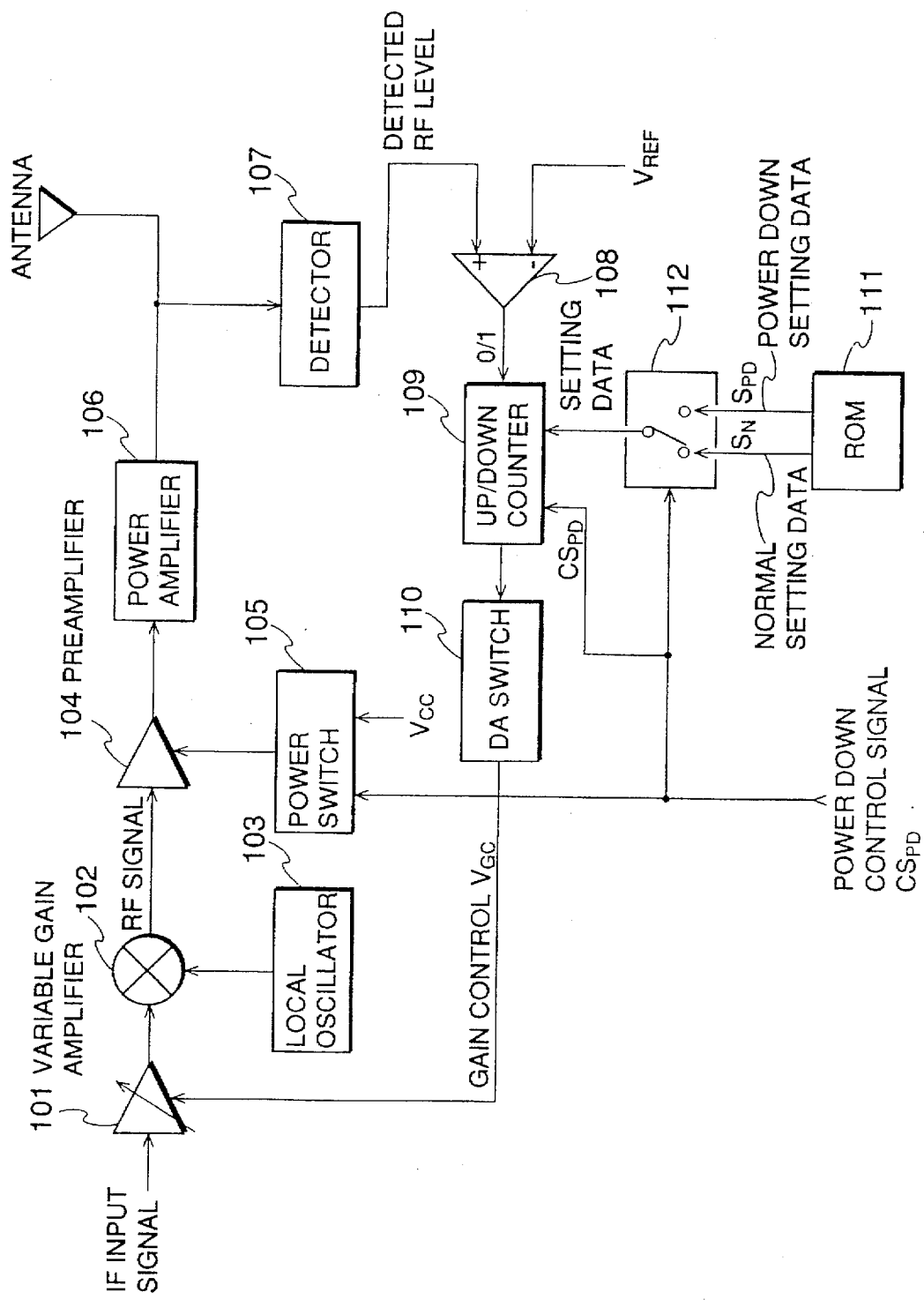
FIG. 1 is a circuit diagram showing an ALC loop of a radio transmitter according to an embodiment of the present invention.

Referring to FIG. 1, a transmitter according to an embodiment of the present invention includes a variable gain amplifier 101 which amplifies the power level of an intermediate-frequency (IF) input signal received from a modulator (not shown) by adjusting its gain according to a gain control voltage $V_{GC}$. Here, the IF input signal is produced according to pi/4-shift QPSK (quadrature phase shift keying) modulation with a center frequency of 250 MHz. The IF output signal of the variable gain amplifier 101 is converted into a radio-frequency (RF) signal with a center frequency of 1.9 GHz by a mixer 102 and a local oscillator 103. The RF signal is amplified by a preamplifier 104 to which power is supplied or removed by a power switch 105. The RF output signal of the preamplifier 104 is amplified in power by a power amplifier 106 and then is emitted from an antenna.

The output of the power amplifier 106 is connected to a detector 107 which detects an RF level of the RF output signal of the power amplifier 106. The detector 107 may be selected as necessary from a variety of RF detectors comprising an RF detecting device such as a diode. The detected RF level is output to a comparator 108 where the detected RF level is compared to a reference voltage $V_{REF}$. The comparator 108 produces a comparison signal of the logical value 1 when the detected RF level is equal to or greater than the reference voltage $V_{REF}$, and produces a comparison signal of the logical value 0 when the detected RF level is lower than the reference voltage $V_{REF}$.

Receiving the comparison signal from the comparator 108, an up/down counter 109 increments or decrements with each received logical value according to a predetermined clock signal. More specifically, the up/down counter 109 decrements when a comparison signal of '1' is received from the comparator 108 because the RF output signal exceeds a desired level indicated by the reference voltage $V_{REF}$. Contrarily, the up/down counter 109 increments when a comparison signal of '0' is received because the RF output signal is below the desired level. However, as described later, the operation of the up/down counter 109 is determined according to setting data $S_N$ or $S_{PD}$ and a power-down control signal $CS_{FD}$. The digital count data of the up/down counter 109 is output to a digital-to-analog (DA) switch 110 which converts the digital count data into a corresponding analog voltage to be used as the gain control voltage $V_{GC}$.

A read-only memory (ROM) 111 stores normal and power-down setting data $S_N$ and $S_{PD}$, and a selector 112 selects one of them to output it to the up/down counter 109 so as to determine the operation of the up/down counter 109. The selector 112 normally selects the normal setting data SN when the power-down control signal $CS_{PD}$ is logically low and selects the power-down setting data $S_{PD}$ when the power-down control signal $CS_{FD}$ is logically high.

The up/down counter 109, normally receiving the normal setting data from the ROM 111 through the selector 112, performs the up/down counting operation according to the comparison signal received from the comparator 108 as described above. In other words, the ALC loop is active when the power-down control signal $CS_{PD}$ is of the logical low value '0'. On the other hand, when receiving the power-down control signal $CS_{PD}$ of the logical high value '1', the selector 112 selects the power-down setting data $S_{PD}$ and, at the same time, the up/down counter 109 stops counting and outputs a predetermined digital value to the DA switch 110 according to the power-down setting data received from the ROM 111 through the selector 112. The DA switch 110 converts the predetermined digital value into a corresponding gain control analog voltage $V_{GC}$ which is a relatively low fixed voltage. Therefore, the ALC loop turns off when the power-down control signal $CS_{PD}$ is of the logical high value ''.

It should be noted that the up/down counter 109 and the DA switch 110 may comprise one compartment. Such a one-piece DA converter is manufactured by Asahi Kasei Microsystems Co., Ltd., for example, a D/A converter "AK2393" which outputs an analog voltage ranging from 1.2 V to 2.0 V divided into 1024 steps.

The power-down control signal $CS_{PD}$ is also provided to the power switch 105. The power switch 105 supplies the power supply voltage Vcc to the preamplifier 104 when the power-down control signal $CS_{PD}$ is of the logical low value '0', that is, the ALC is normally active. Therefore, the preamplifier 104 amplifies the RF input signal by a predetermined amplification factor (in this example, 10 dB). when the power-down control signal $CS_{PD}$ goes high, that is, the ALC turns off, the power switch 105 removes the power supply voltage Vcc from the preamplifier 104, which causes the preamplifier 104 to be inactive. As described later, the preamplifier 104 inactive exhibits attenuation characteristics (in this example, more than 10 dB attenuation).

In the ALC loop as shown in FIG. 1, the variable gain amplifier 101 varies in gain according to the gain control voltage $V_{GC}$ so as to keep the power level of the RF output signal in the stable state when the power-down control signal $CS_{PD}$ is of the logical value '0'. More specifically, as the level of the RF output signal is increasing and then exceeds the reference voltage $V_{REF}$, the up/down counter 109 starts decrementing, which causes the control voltage $V_{GC}$ to decrease. On the other hand, when the level of the RF output signal decreases below the reference voltage $V_{REF}$, the up/down counter 109 starts incrementing, which causes the control voltage $V_{GC}$ to increase.

When the power-down control signal $CS_{PD}$ is of the logical value '1', the up/down counter 109 stops counting and outputs a fixed digital value determined by the power-down setting data $S_{PD}$ to the DA switch 110. Therefore, the ALC loop turns off and the variable gain amplifier 101 amplifies the IF input signal by a fixed amplification factor determined by the gain control voltage $V_{GC}$. The fixed digital value produced by the up/down counter 109 is determined such that the RF output signal of the power amplifier 106 is kept at a desired low level.

Further, receiving the power-down control signal $CS_{PD}$ of the logical value '1', the power switch 105 disconnects the preamplifier 104 from the power supply voltage Vcc, causing the preamplifier 104 to be inactive. Therefore, the dynamic range of the RF output signal can be extended by the gain of the preamplifier 104 when active and the attenuation when inactive in addition to the dynamic range of the variable gain amplifier 101. The detailed description will be provided later.

Figure 2:
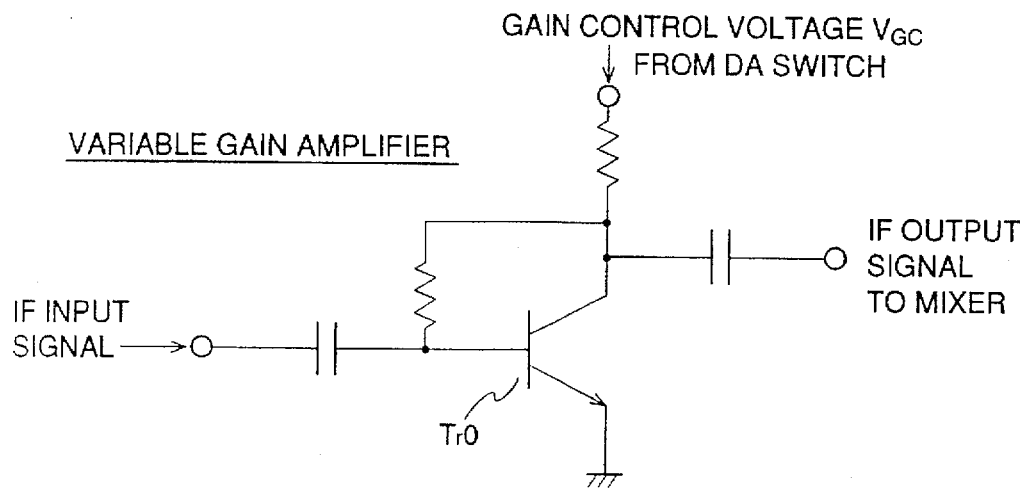
FIG. 2 is a detailed circuit diagram showing an example of a variable gain amplifier of the ALC loop as shown in FIG. 1.

Referring to FIG. 2, the variable gain amplifier 101 is a common-emitter type amplifier comprising a bipolar transistor Tr0. The gain control voltage $V_{GC}$ received from the DA switch 110 is applied to the collector of the transistor Tr0 as a power supply voltage. Since the power gain of the bipolar transistor Tr0 is partially proportional to its collector current, as is well known, the power gain of the transistor Tr0 can be controlled by adjusting the gain control voltage $V_{GC}$. The dynamic range of the RF output signal when the ALC loop is active is determined depending on the variable gain range of the transistor Tr0. Therefore, the dynamic range of the transmission level control when the ALC loop is active is on the order of 20 dB.

Figure 3:
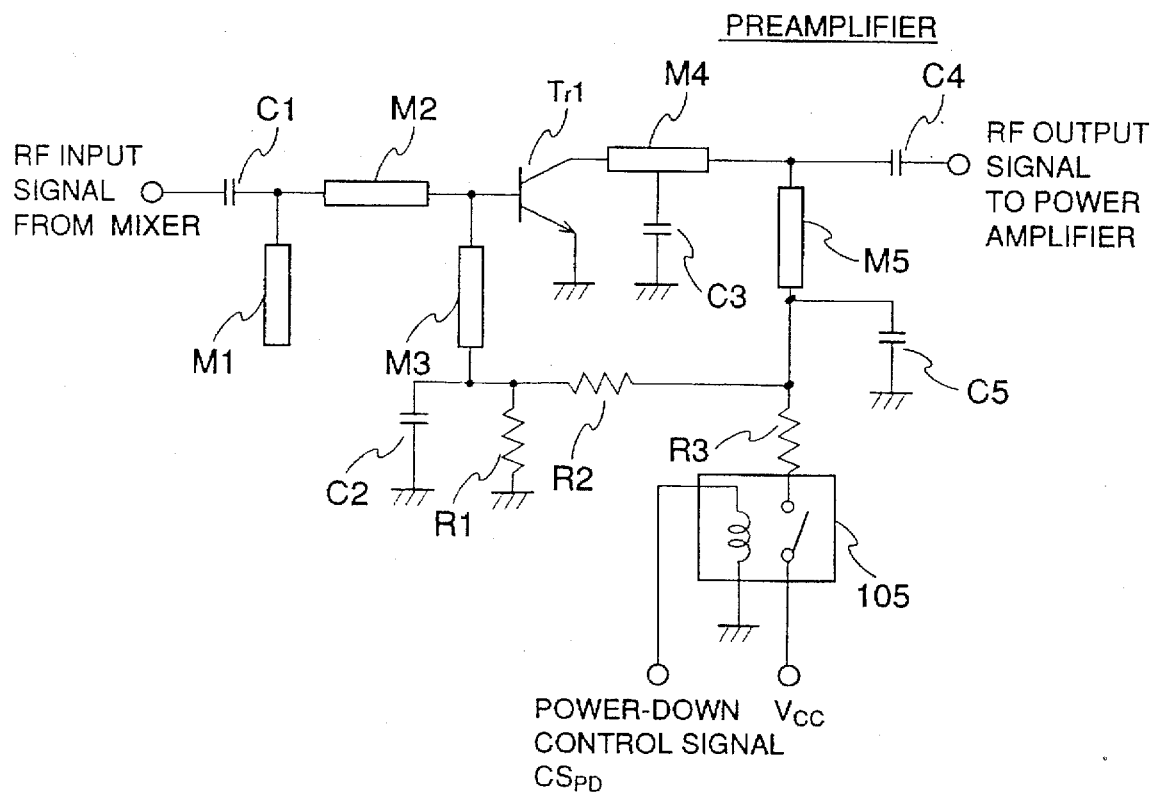
FIG. 3 is a detailed circuit diagram showing an example of a preamplifier of the ALC loop as shown in FIG. 1.

Referring to FIG. 3, the preamplifier 104 is a single-transistor amplifier comprising a bipolar transistor Tr1 and other necessary circuit elements which are formed on a strip substrate. The RF input signal received from the mixer 102 is applied to the base of the transistor Tr1 through a coupling capacitor C1 and an input matching circuit comprising strip lines M1–M3. The transistor Tr1 amplifies the RF input signal and the amplified RF signal is output from the collector to the power amplifier 106 through an output matching circuit comprising a capacitor C3 and strip lines M4 and M5 and then a coupling capacitor C4. A capacitor C5 is an RF by-pass capacitor.

The power switch 105 is formed with a relay which performs switching of the power supply voltage Vcc according to the power-down control signal $CS_{PD}$. when the power-down control signal $CS_{PD}$ is normally low, the relay 105 is closed, and the power supply voltage Vcc is applied to the collector of the transistor Tr1 through the relay 105, a resistor R3 and the strip lines M5 and M4, and further to the base through the relay 105 and a bias circuit comprising resistors R1–R3, an RF by-pass capacitor C2, and the strip line M3. When the power-down control signal $CS_{PD}$ is high, the relay 105 is open, and the power supply voltage Vcc is not applied to the collector and base of the transistor Tr1. In such an inactive state, the transistor Tr1 serves as an attenuator such that a part of the RF input signal applied to the base of the transistor Tr1 is transferred to the collector through the base-collector capacitance of the transistor Tr1. Taking a bipolar transistor "2SC5015" manufactured by NEC Corporation as an example of the transistor Tr1, the gain and attenuation characteristics thereof are shown in FIGS. 4A and 4B.

Figure 4A:
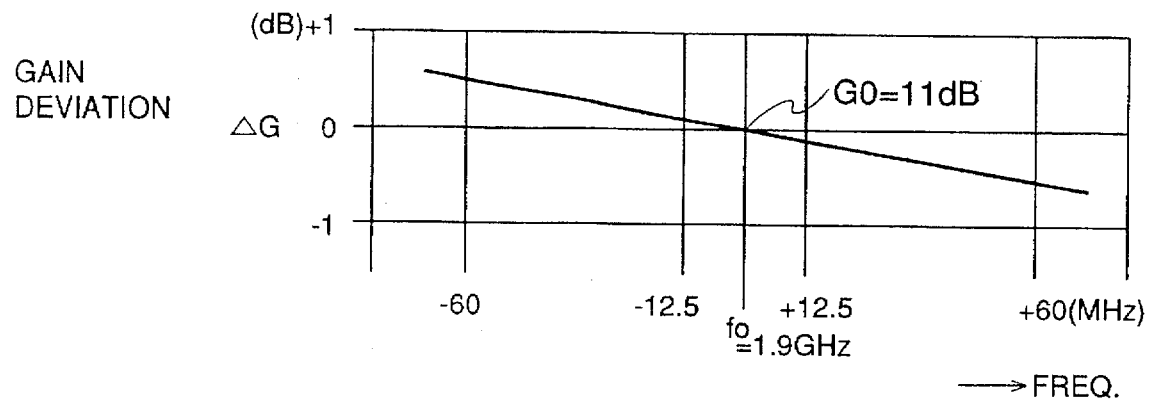
Figure 4B:
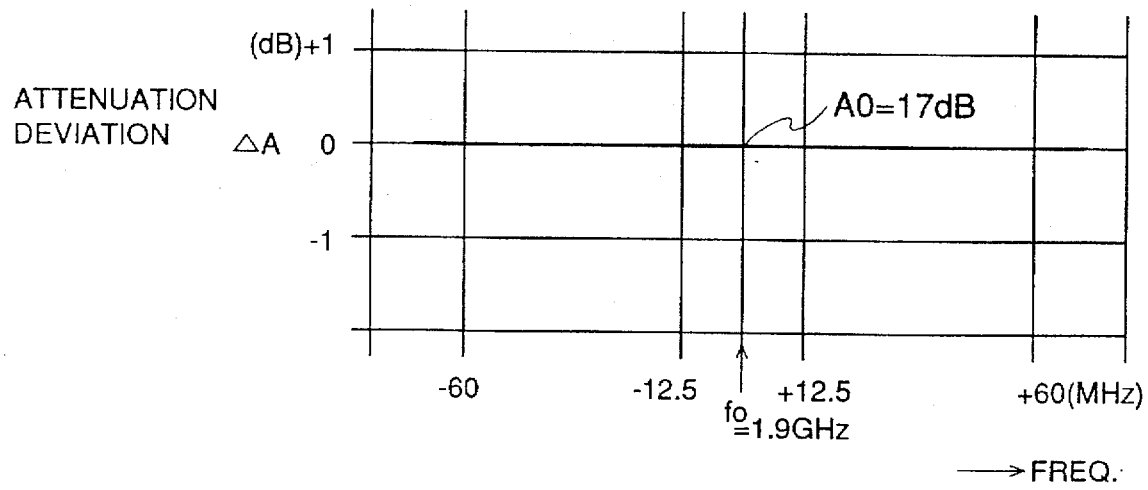
FIG. 4B is a graph showing the attenuation deviation characteristics of the preamplifier when the power switch is off.

Referring to FIG. 4A, when Vcc (here, Vcc=3 V) is applied to the transistor Tr1 through the relay 105, the gain G0 at fo=1.9 GHz is about 11 dB and the gain deviation $\Delta G$ within a frequency band of fo±12.5 MHz is about 0.2 dB. When the relay 105 is open, as shown in FIG. 4B, the attenuation A0 at fo=1.9 GHz is about 17 dB and the attenuation deviation $\Delta A$ within the frequency band of fo±12.5 MHz is almost negligible. Therefore, the level difference due to the ON/OFF switching of the relay 105 is approximately 28 dB. As described before, since the dynamic range of the variable gain amplifier 101 is about 20 dB, the dynamic range of the RF output signal can be extended to more than 40 dB (here, 48 dB) by adding the level difference due to the ON/OFF switching of the relay 105 to the dynamic range of the variable gain amplifier 101 when the ALC loop is active.

Figure 5:
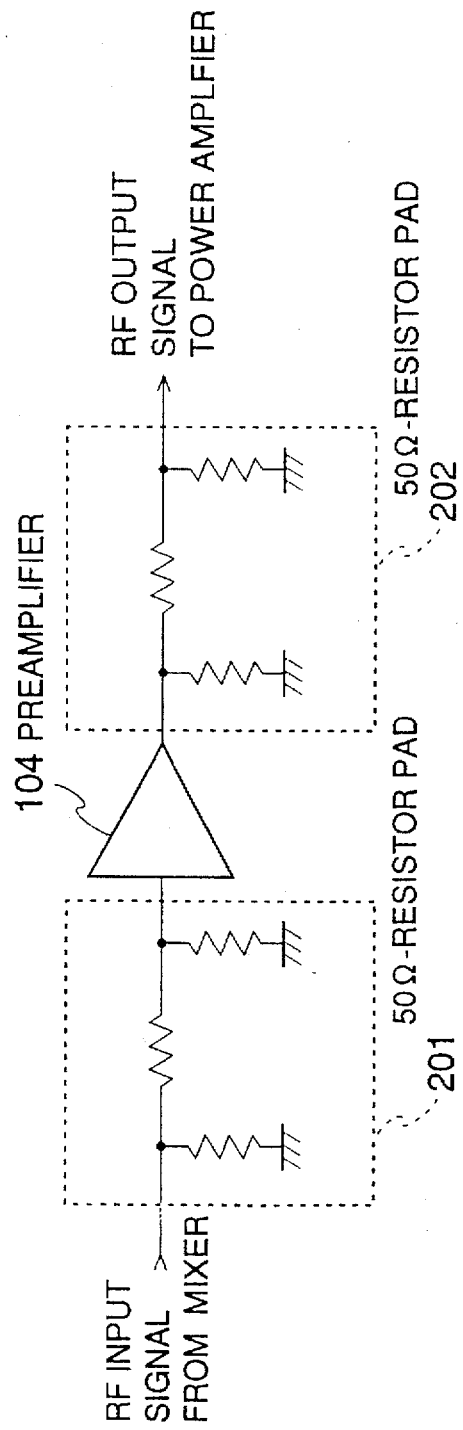
FIG. 5 is a detailed circuit diagram showing a part of a transmitter according to another embodiment of the present invention.

There may be cases where the preamplifier 104 exhibits the deterioration of the input-output impedance match when the power switch 105 is open, that is, the bipolar transistor Tr1 is inactive. In order to improve the input-output impedance match, the preamplifier 104 is preferably provided with an impedance matching circuit between the input and output thereof as necessary. An isolator or a pad may be used as the impedance matching circuit. As shown in FIG. 5, the input and output sides of the preamplifier 104 is provided with 50 $\Omega$-resistor pads 201 and 202, respectively.

The present invention is not restricted to the above embodiments. The ROM 111 may store three or more setting data including a plurality of power-down setting data. More specifically, by the selector 112 selecting one of the setting data, a desired gain control voltage $V_{GC}$ is produced by the DA switch and thereby the power level of the RF output signal is set at a relatively low desired level.

What is claimed is:

1. A transmitter comprising:

a first amplifier for amplifying an input high-frequency signal to produce a first high-frequency signal;

a frequency converter for converting the first high-frequency signal to a first radio-frequency (RF) signal;

a second amplifier for amplifying the first RF signal to produce a second RF signal, the second amplifier being controlled by a control signal such that the first RF signal is amplified by a fixed factor when the control signal is in a first state and the first RF signal is attenuated by a fixed degree when the control signal is in a second state;

a third amplifier for amplifying the second RF signal to produce an output Rf signal;

a detector for detecting an output level of the output Rf signal; and a first controller for controlling the first amplifier to amplify variably, the first amplifier being adjusted based on the output level so as to keep the output level at a first predetermined level when the control signal is in the first state; and a second controller for controlling the first amplifier such that the amplification factor of the first amplifier is set at a predetermined value so as to set the output level at a second predetermined level lower than the first predetermined level when the control signal is in the second state.

2. The transmitter according to claim 1, wherein the first controller comprises:

a comparator for comparing the output level to a predetermined reference level to produce a comparison signal;

a counter for either incrementing or decrementing according to the comparison signal to produce a digital count value; and a converter for converting the digital count value into an analog voltage corresponding to the digital count value and supplying the analog voltage to the first amplifier to adjust the variable amplification factor.

3. The transmitter according to claim 2, wherein the second controller comprises:

a memory for storing setting data which sets the first controller such that the variable amplification factor of the first amplifier is set at the predetermined value; and a counter controller for controlling the counter such that the digital count value is fixed to a value corresponding to the setting data read from the memory when the control signal is in the second state.

4. The transmitter according to claim 2, wherein the first amplifier is a variable gain amplifier including a single bipolar transistor, wherein the analog voltage is applied to a collector of the bipolar transistor as a power supply voltage.

5. The transmitter according to claim 1, wherein the second controller comprises:

a memory for storing setting data which sets the first controller such that the variable amplification factor of the first amplifier is set at the predetermined value; and a selector for selecting the setting data from the memory to provide the setting data to the first controller when the control signal is in the second state.

6. The transmitter according to claim 1, wherein the second amplifier comprises:

an amplifier for amplifying the first RF signal; and a power controller for activating the amplifier according to the control signal.

7. The transmitter according to claim 1, wherein the second amplifier comprises:

an amplifier for amplifying the first RF signal; and a switch for switching the amplifier on or off according to the control signal.

8. The transmitter according to claim 7, wherein the amplifier comprises a single bipolar transistor, wherein the power is supplied to a collector of the single bipolar transistor through the switch.

9. The transmitter according to claim 7, wherein the switch supplies power to the amplifier when the control signal is in the first state and removes the power from the amplifier when the control signal is in the second state.

10. The transmitter according to claim 9, wherein the amplifier comprises a single bipolar transistor, wherein the power is supplied to a collector of the single bipolar transistor through the switch.

11. The transmitter according to claim 1, wherein the second amplifier comprises impedance matching means for matching an input-output impedance of the second amplifier.

12. A control method of an output level of a transmission signal, the method comprising the steps of:

amplifying an input high-frequency signal by a variable amplification factor to produce a first high-frequency signal;

producing a second high-frequency signal corresponding to the first high-frequency signal, the first high-frequency signal being amplified to produce the second high-frequency signal when a control signal is in a first state, and the first high-frequency signal being attenuated to produce the second high-frequency signal when the control signal is in a second state;

amplifying the second high-frequency signal to produce the transmission signal;

detecting the output level of the transmission signal; and adjusting the variable amplification factor based on the output level so as to keep the output level at a first predetermined level when the control signal is in the first state; and setting the variable amplification factor at a predetermined value so as to set the output level at a second predetermined level lower than the first predetermined level when the control signal is in the second state.

13. The control method according to claim 12, wherein the adjusting step of the variable amplification factor comprises the steps of:

comparing the output level to a predetermined reference level to produce a comparison signal;

incrementing a counter to produce a digital count value when the output level is lower than the predetermined reference level;

decrementing the counter to produce the digital count value when the output level is not lower than the predetermined reference level; and converting the digital count value into an analog voltage corresponding to the digital count value so that the analog voltage is used to adjust the variable amplification factor.

14. The control method according to claim 13, wherein the setting step of the variable amplification factor comprises the steps of:

storing setting data which sets the variable amplification factor at the predetermined value; and controlling the counter such that the digital count value is fixed to a value corresponding to the setting data when the control signal is in the second state.

15. The control method according to claim 12, wherein the setting step of the variable amplification factor comprises the steps of:

storing setting data which sets the variable amplification factor at the predetermined value; and selecting the setting data to set the output level at the second predetermined level when the control signal is in the second state.

16. The control method according to claim 12, wherein the producing step of the second high-frequency signal comprises the step of activating an amplifier according to the control signal, the amplifier amplifying the first high-frequency signal to produce the second high-frequency signal.

17. The control method according to claim 12, wherein the producing step of the second high-frequency signal comprises the step of switching an amplifier on or off according to the control signal, the amplifier amplifying the first high-frequency signal to produce the second high-frequency signal.

18. A circuit comprising:

a first means for amplifying an input signal to produce a first signal;

a second means for conditioning the first signal to produce a second signal;

a third means for amplifying the second signal to produce an output signal;

a detecting means for detecting an output level of the output signal; and a control means for controlling the first means;

wherein operation of the circuit is influenced by a control signal, such that while the control signal is in a first state, the first means amplifies the input signal variably as regulated by the control means based on the detected output level to maintain the output level at a first predetermined level, and the second means amplifies the first signal by a fixed factor, whereas while the control signal is in a second state, the first means amplifies the input signal by a fixed factor and the second means attenuates the first signal by a fixed degree.

19. The circuit according to claim 18, wherein the control means comprises:

feedback control means for controlling the a first means such that the variable amplification factor of the first means is adjusted based on the output level so as to keep the output level at the first predetermined level; and setting control means for setting the feedback control means such that the variable amplification factor of the first means is set at the predetermined value when the control signal is in the second state.

20. The circuit according to claim 19, wherein the feedback control means comprises:

a comparator for comparing the output level to a predetermined reference level to produce a comparison signal;

a counter for either incrementing or decrementing according to the comparison signal to produce a digital count value; and a converter for converting the digital count value into an analog voltage corresponding to the digital count value and supplying the analog voltage to the first means to adjust the variable amplification factor.

21. The circuit according to claim 20, wherein the setting control means comprises:

storage means for storing setting data which sets the feedback control means such that the variable amplification factor of the first means is set at the predetermined value; and counter control means for controlling the counter such that the digital count value is fixed to a value corresponding to the setting data read from the storage means when the control signal is in the second state.

22. The circuit according to claim 20, wherein the first means comprises a variable gain amplifier including a single bipolar transistor, wherein the analog voltage is applied to a collector of the bipolar transistor as a power supply voltage.

23. The circuit according to claim 19, wherein the setting control means comprises:

storage means for storing setting data which sets the feedback control means such that the variable amplification factor of the first means is set at the predetermined value; and selecting means for selecting the setting data from the storage means to provide the setting data to the feedback control means when the control signal is in the second state.

24. The circuit according to claim 1, wherein the control means comprises:

first control means for controlling the first means such that the variable amplification factor of the first means is adjusted based on the output level so as to keep the output level at the first predetermined level when the control signal is in the first state; and second control means for controlling the first means such that the variable amplification factor of the first means is set at a predetermined value so as to set the output level at the second predetermined level when the control signal is in the second state.

25. The circuit according to claim 18, wherein the second means comprises:

amplifying means for amplifying the first signal to produce the second signal; and power control means for activating the amplifying means according to the control signal.

26. The circuit according to claim 1, wherein the second means comprises:

an amplifier for amplifying the first signal to produce the second signal; and a switch for switching the amplifier on or off according to the control signal.

27. The circuit according to claim 26, wherein the switch supplies power to the amplifier when the control signal is in the first state and removes the power from the amplifier when the control signal is in the second state.

28. The circuit according to claim 29, wherein the amplifier comprises a single bipolar transistor, wherein the power is supplied to a collector of the single bipolar transistor through the switch.

29. The circuit according to claim 26, wherein the amplifier comprises a single bipolar transistor, wherein the power is supplied to a collector of the single bipolar transistor through the switch.

30. The circuit according to claim 18, wherein the second means comprises impedance matching means for matching an input-output impedance of the second means.

31. A circuit comprising:

a first amplifier for receiving an input signal and producing a first signal;

a second amplifier for receiving the first signal and producing a second signal, the second amplifier being designed to amplify the first signal by a fixed factor when the second amplifier is supplied with power, the second amplifier being designed to attenuate the first signal by a fixed degree when the second amplifier is not supplied with power;

a third amplifier for receiving the second signal and producing an output signal;

a detector for detecting an output level of the output signal; and a control means for controlling the first amplifier;

wherein while the second amplifier is supplied with power, the first means amplifies the input signal variably as regulated by the control means based on the detected output level to maintain the output level at a first predetermined level, whereas while the second amplifier is not supplied with power, the first means amplifies the input signal by a fixed factor.

32. The circuit according to claim 31, wherein the second amplifier comprises impedance matching means for matching an input-output impedance of the second amplifier.

33. A transmission level control circuit comprising:

a negative feedback loop comprising:

a first means for amplifying an input high-frequency signal to produce a first high-frequency signal;

a second means for conditioning the first high-frequency signal to produce a second high-frequency signal;

a third means for amplifying the second high-frequency signal to produce an output high-frequency signal;

a detecting means for detecting an output level of the output high-frequency signal; and a control means for controlling the first means;

wherein operation of the circuit is influenced by a control signal, such that while the control signal is in a first state, the first means amplifies the input high-frequency signal variably as regulated by the control means based on the detected output level to maintain the output level at a first predetermined level, and the second means amplifies the first high-frequency signal by a fixed factor, whereas while the control signal is in a second state, the first means amplifies the high-frequency input signal by a fixed factor and the second means attenuates the first high-frequency signal by a fixed degree.

34. The transmission level control circuit according to claim 33, wherein the control means of the negative feedback loop comprises:

a comparator for comparing the output level to a predetermined reference level to produce a comparison signal;

a counter for either incrementing or decrementing according to the comparison signal to produce a digital count value; and a converter for converting the digital count value into an analog voltage corresponding to the digital count value and supplying the analog voltage to the first means to adjust the variable amplification factor.

35. The transmission level control circuit according to claim 34, wherein the power reduction control means comprises:

storage means for storing setting data which sets the control means of the negative feedback loop such that the variable amplification factor of the first means is set at the predetermined value; and counter control means for controlling the counter such that the digital count value is fixed to a value corresponding to the setting data read from the storage means when the control signal is in the second state.

36. The transmission level control circuit according to claim 34, wherein the first means comprises a variable gain amplifier including a single bipolar transistor, wherein the analog voltage is applied to a collector of the bipolar transistor as a power supply voltage.

37. The transmission level control circuit according to claim 33, wherein the power reduction control means comprises:

storage means for storing setting data which sets the control means of the negative feedback loop such that the variable amplification factor of the first means is set at the predetermined value; and selecting means for selecting the setting data from the storage means to provide the setting data to the control means when the control signal is in the second state.

38. The transmission level control circuit according to claim 33, wherein the second means comprises:

amplifying means for amplifying the first high-frequency signal to produce the second high-frequency signal; and power control means for activating the amplifying means according to the control signal.

39. The transmission level control circuit according to claim 33, wherein the second means comprises:

an amplifier for amplifying the first high-frequency signal to produce the second high-frequency signal; and a switch for switching the amplifier on or off according to the control signal.

40. The transmission level control circuit according to claim 39, wherein the switch supplies power to the amplifier when the control signal is in the first state and removes the power from the amplifier when the control signal is in the second state.

41. The transmission level control circuit according to claim 40, wherein the amplifier comprises a single bipolar transistor, wherein the power is supplied to a collector of the single bipolar transistor through the switch.

42. The transmission level control circuit according to claim 39, wherein the amplifier comprises a single bipolar transistor, wherein the power is supplied to a collector of the single bipolar transistor through the switch.

43. The transmission level control circuit according to claim 33, wherein the second means comprises impedance matching means for matching an input-output impedance of the second means.

* * * * *